United States Patent [19]
Taylor et al.

[11] Patent Number: 5,888,905
[45] Date of Patent: Mar. 30, 1999

[54] INTEGRATED CIRCUIT INSULATOR AND METHOD

[75] Inventors: Kelly J. Taylor; Mona Eissa, both of Plano, Tex.

[73] Assignee: Texas Instruments Incorporated, Dallas, Tex.

[21] Appl. No.: 965,080

[22] Filed: Nov. 6, 1997

Related U.S. Application Data

[60] Provisional application No. 60/029,749 Nov. 8, 1996.

[51] Int. Cl.$^6$ .................................................. H01L 21/302
[52] U.S. Cl. ........................ 438/705; 438/694; 438/697; 438/725
[58] Field of Search ................................. 438/694, 697, 438/705, 725

[56] References Cited

U.S. PATENT DOCUMENTS 4,946,549  8/1990  Bachman et al. ...................... 156/643
5,268,202  12/1993  You et al. ............................. 427/255.1

FOREIGN PATENT DOCUMENTS

6-112336  4/1994  Japan .
9-071672  3/1997  Japan .

*Primary Examiner*—Benjamin Utech
*Assistant Examiner*—George Goudreau
*Attorney, Agent, or Firm*—Carlton H. Hoel; W. James Brady; Richard L. Donaldson

[57] ABSTRACT

A intermetal level dielectrics with fluorinated (co)polymers of parylene (142) between metal lines (112–120), and vapor deposition method for the (co)polymerization followed by fluorination of the (co)polymers.

5 Claims, 6 Drawing Sheets

INTEGRATED CIRCUIT INSULATOR AND METHOD

BACKGROUND OF THE INVENTION

The invention relates to semiconductor devices, and, more particularly, to integrated circuit insulation and methods of fabrication.

Integrated circuits typically include field effect transistors with source/drains formed in a silicon substrate and insulated gates on the substrate together with multiple overlying metal (or polysilicon) interconnections formed in levels. An insulating layer lies between the gates/sources/drains and the interconnections formed from the first metal level (premetal dielectric) and also between successive metal levels (intermetal-level dielectric). Vertical vias in the insulating layers filled with metal (or polysilicon) provide connections between interconnections formed in adjacent metal levels and also between the gate/source/drain and the first metal level interconnections. Each insulating layer must cover the relatively bumpy topography of the interconnections of a metal level or the gates, and this includes crevices between closely spaced interconnects in the same metal level. Also, the dielectric constant of the insulating layer should be as low as practical to limit capacitive coupling between closely spaced interconnects in the same metal level and in adjacent overlying and underlying metal levels.

Various approaches to forming insulating layers over bumpy topography have been developed which all form a silicon dioxide (oxide) type insulator: reflowing deposited borophosphosilicate glass (BPSG), using spin-on glass (SOG) which typically are siloxanes, sputtering while depositing in plasma enhanced chemical vapor deposition (PECVD) with tetraethoxysilane (TEOS), etching back a stack of deposited glass plus spun-on planarizing photoresist, and chemical-mechanical polishing (CMP).

All these approaches have problems including the relatively high dielectric constant of silicon dioxide: roughly 3.9. This limits how closely the interconnections can be packed and still maintain a low capacitive coupling.

Laxman, Low ε Dielectrics: CVD Fluorinated Silicon Dioxides, 18 Semiconductor International 71 (May 1995), summarizes reports of fluorinated silicon dioxide for use as an intermetal level dielectric which has a dielectric constant lower than that of silicon dioxide. In particular, PECVD using silicon tetrafluoride ($SiF_4$), silane ($SiH_4$), and oxygen ($O_2$) source gasses can deposit $SiO_XF_Y$ with up to 10% fluorine and a dielectric constant in the range 3.0 to 3.7. But this dielectric constant still limits the packing density of interconnections.

Organic polymer insulators provide another approach to low dielectric constant insulators. Formation by chemical vapor deposition (CVD) ensures filling of crevices between closely spaced interconnections. Some integrated circuit fabrication methods already include polyimide as a protective overcoat. However, polyimide has problems including a dielectric constant of only about 3.2–3.4 and an affinity to absorb water which disrupts later processing when used as an intermetal level dielectric. On the positive side, it does have a temperature tolerance up to about 500° C.

Parylene is a generic term for a class of poly-para-xylylenes with structures such as the following:

PA-N          PA-F

These polymers are members of a family of thermoplastic polymers that have low dielectric constants (e.g., 2.35 to 3.15), low water affinity, and may be conformally deposited from a vapor without solvents and high temperature cures. Parylene with hydrogen on the aliphatic carbons may be used at temperatures up to about 400° C. under an $N_2$ atmosphere, whereas aliphatic perfluorination increases the useful temperature to about 530° C.

You et al., Vapor Deposition of Parylene Films from Precursors, in Chemical Perspectives of Microelectronic Materials III, Materials Research Society Symposium Proceedings Nov. 30, 1992, discloses a method for fabrication of fluorinated parylene by starting with a liquid dibromotetra-fluoro-p-xylene precursor and then converting the precursor at 350° C. to active monomers which adsorb and polymerize at −15° C. on a substrate. The reaction looks like:

You et al. synthesize the precursor from the dialdehyde (terephthalaldehyde):

The benzene ring could also be (partially) fluorinated with standard halogenation methods. Such fluorination would lower the dielectric constant and increase the useful temperature.

The parylene films may also be deposited with the use of dimers of the active monomers as an intermediate product. See, You et al. and Dolbier et al., U.S. Pat. No. 5,210,341, as in the reaction:

-continued

However, these fluorinated parylene approaches have problems including inefficient precursor preparation and a lack of commercially available precursors.

SUMMARY OF THE INVENTION

The present invention provides a two-step formation of fluorinated parylene and affiliated polymer and copolymer films by deposition of a film followed by direct fluorination of the film.

Advantages of the invention include a simpler vapor deposition of a polymer film from simpler precursors with the fluorination deferred until after vapor deposition. Further, the fluorination after vapor deposition replaces hydrogen with fluorine and a consequent increase in film volume which helps fill in narrow gaps and eliminates voids.

BRIEF DESCRIPTION OF THE DRAWINGS

The drawings are schematic for clarity.

DESCRIPTION OF THE PREFERRED EMBODIMENTS

Imbedded polymer preferred embodiment

FIGS. 1a–e illustrate in cross sectional elevation view the steps of a first preferred embodiment method of insulator dielectric formation between metal lines during integrated circuit fabrication. In particular, start with the partially fabricated circuit of FIG. 1a which includes polysilicon gate 104 and field oxide 106 on silicon substrate 102 and lying under premetal level dielectric (PMD) 110 with metal lines 112–120 on PMD 110 and metal filled vias 122–124 extending through PMD 110. PMD 110 may be silicon dioxide and include dopants such as boron and phosphorus to form BPSG; the dopants help trap mobil ions. Indeed, PMD 110 may be a layered structure with undoped silicon dioxide in contact with the gates and with BPSG over the undoped oxide. The metal lines may be made of aluminum with TiN cladding on top and bottom. Metal lines 112–120 are 0.25–0.5 μm wide and 0.5 μm high with only 0.25–0.5 μm spacing between lines 112–116 and between lines 118–120. Thus the dielectric constant of the insulator between the metal lines should be as small as possible to limit capacitive coupling.

Figure 1A:
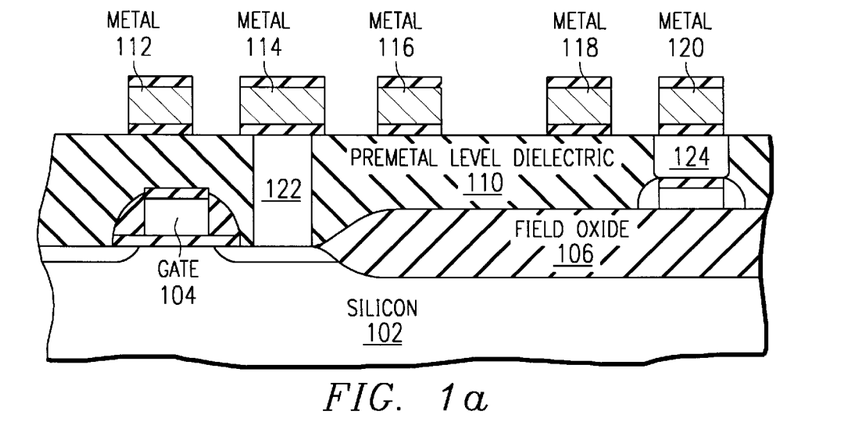
FIGS. 1a–e illustrate in cross sectional elevation views the steps of a first preferred embodiment and method.
Figure 1B:
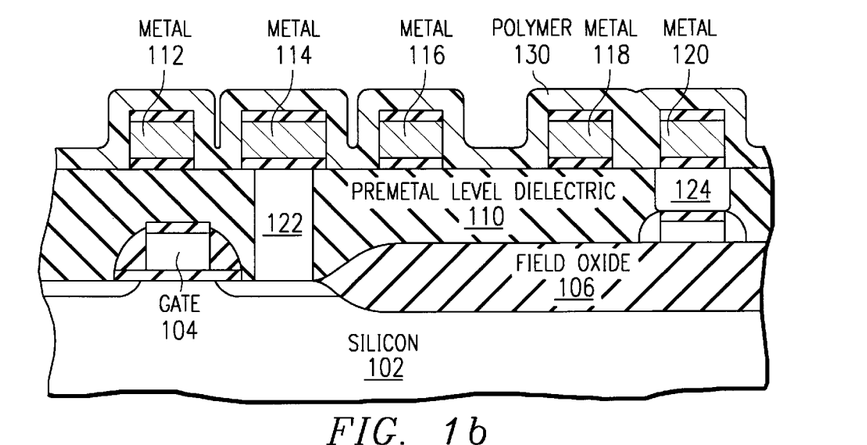

Conformally vapor deposit a 0.15–0.25 μm thick (at least about one-half the minimal spacing between metal lines) layer 130 of parylene on PMD 110 and metal lines 112–120 as shown in FIG. 1b. Note that voids may occur as the deposition pinches off at the tops of minimal spacings as illustrated between metal lines 112–114. Also, some minimal spacings may not completely fill as illustrated between metal lines 114–116.

Figure 2:
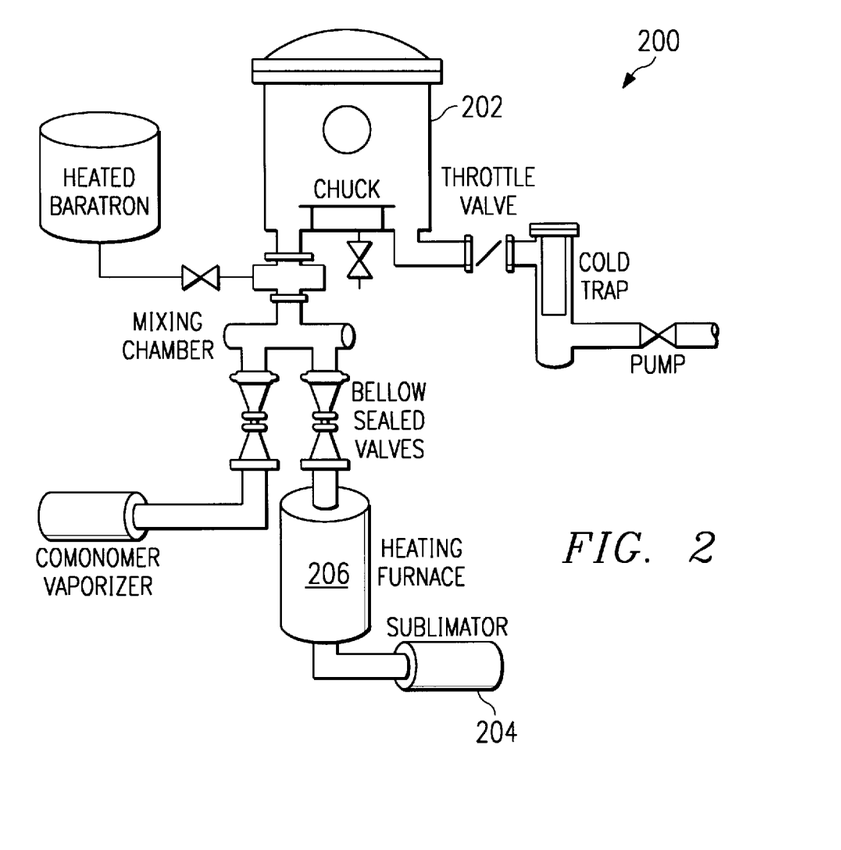
FIG. 2 shows a deposition apparatus.

The deposition occurs in a low pressure (about 13 mTorr) deposition system such as system 200 illustrated in FIG. 2. System 200 has the capacity for copolymer deposition as could be used in alternative embodiments, and a simpler system could be used for this first preferred embodiment. System 200 includes deposition chamber 202 with two valved inlets: one for comonomer vapor which is not used in this preferred embodiment and one for parylene monomers which are derived from dimers sublimated in chamber 204 and then cracked into monomers in furnace 206. Parylene dimer is a solid at room temperature and may be sublimed at 120° C. with a vapor pressure of about 13 mTorr. Maintain the connecting piping and deposition chamber 202 at temperatures above 120° C. to preclude vapor condensation or polymerization on their surfaces. Substrate 102 is chilled to about –25° C. and monomers polymerize on the exposed surface and conformally grow a film of unsubstituted parylene (PA-N). The heated cracker may have a temperature about 660° C. Substrate 102 is the only surface exposed to the monomers with a low enough temperature for vapor condensation or polymerization. The overall reaction looks like:

Next, expose the polymer covered substrate to a flow of 5% fluorine (F$_2$) and 95% helium (as a diluent) at room temperature and a pressure of roughly 50–100 mTorr for roughly 40–60 minutes. The fluorine directly replaces aliphatic and/or aromatic hydrogen in the parylene film 130 by reactions such as:

or where X represents either H or F.

The fluorination reaction yields film 140 of random copolymers of aromatically, aliphatically, and non-fluorinated moieties with a dielectric constant of about 2.3–2.4 as compared to a dielectric constant of about 2.7 for the as-deposited parylene film 130. Further, the fluorination increases the volume (thickness) of the film by roughly 20–40%, depending upon the degree of fluorination. This increase in volume closes the voids and gaps in the minimal spacings and thus moots the vapor deposition problem of void formation. Indeed, the flourine diffuses into the polymer and the reaction products, primarily HF, diffuses out of the polymer and is pumped away. An anneal at about 400° C. will drive off residual volatiles and shrink film 140 up to 10%. Subsequent anneals do not result in further shrinkage.

Figure 1C:
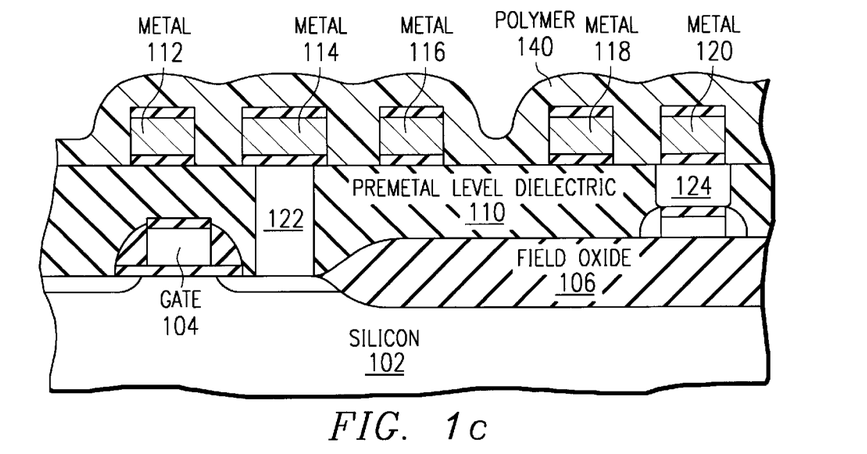
Figure 1D:
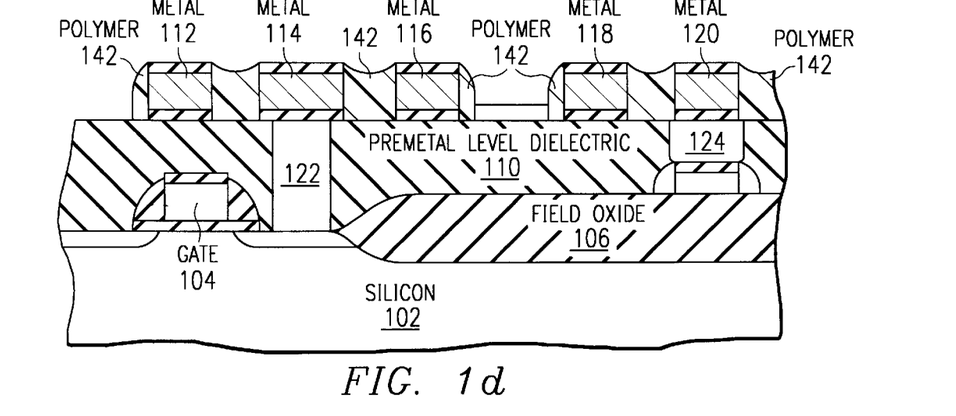

After the formation of fluorinated polymer 140, anisotropically etchback polymer 140 with a fluorine oxygen-based plasma so that polymer only remains in the spaces between adjacent metal lines plus possibly on the sidewalls; see FIG. 1d showing etched back polymer portions 142.

Figure 1E:
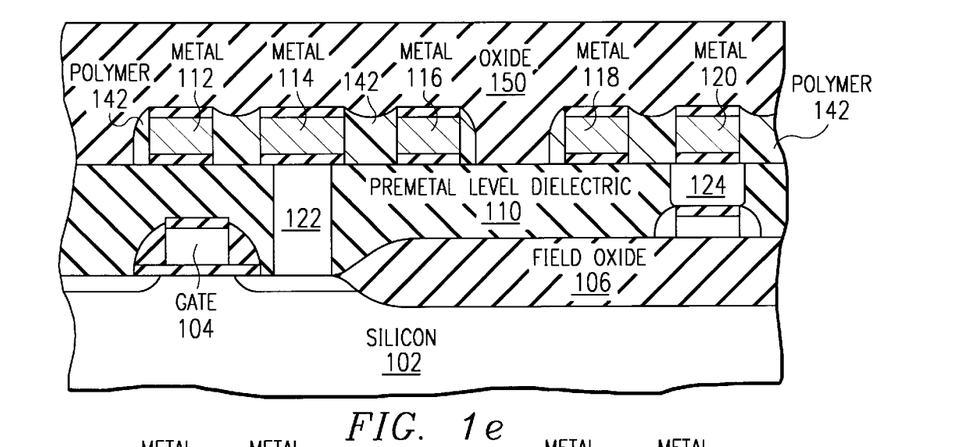

Then deposit a thick (greater than 1 $\mu$m) layer of oxide or fluorinated oxide by plasma enhanced CVD. Lastly, use CMP to planarize the deposited oxide to leave planar oxide 150 as shown in FIG. 1e. Vias may be formed in oxide 150 and another layer of metal wiring formed on oxide 150 with connections down to the metal wiring 112–120 through the vias. This completes the IMD made of fluorinated polymer 142 (dielectric constant 2.3–2.4) adjacent the metal wiring plus the (fluorinated) oxide 150 (dielectric constant about 3.5 for fluorinated oxide). This two-component IMD has very low dielectric polymer in the most important regions: where the metal lines are closest together.

The degree of fluorination can be controlled to substitute up to four fluorines on each benzene ring and up to four aliphatic fluorines on the two carbons between successive benzene rings to yield perfluoro parylene polymer by increasing the time of exposure of the parylene film to the fluorinating environment or increasing the temperature. The fluorination temperature is conveniently less than about 35° C. and the pressure less than about 1 atmosphere. The fluorination time will depend upon film thickness and degree of fluorination desired as well as temperature and pressure. A fully fluorinated perfluoro polymer is quite reactive, so preferably fluorination of only about 60–70% of the total sites available (four on each benzene ring and four aliphatic between successive rings) are fluorinated.

The degree of fluorination can be determined by measuring the molar ratio of carbon to fluorine or the molar ratio of carbon to hydrogen. The substitution of fluorine is somewhat random, so the molar ratios will usually not be precise fractions such as 8/5 which would be the case when using a fluorinated monomer in the polymerization. For example, with a monomer having the four aliphatic carbons fluorinated, the carbon to fluorine molar ratio will be 8/4.

Precursor preparation

The parylene dimer is a commercially available product with prices of less than $1 per gram.

Copolymer variations

The preferred embodiment approach of vapor deposition of a polymer followed by fluorination may also be used for polymers other than parylene, including copolymers of parylene with other monomers which may or may not themselves be fluorinatable. Indeed, one or more of the monomer(s) may be partially fluorinated, and the fluorination after deposition providing the film swelling and dielectric constant lowering.

Blanket polymer preferred embodiment

Figure 3:
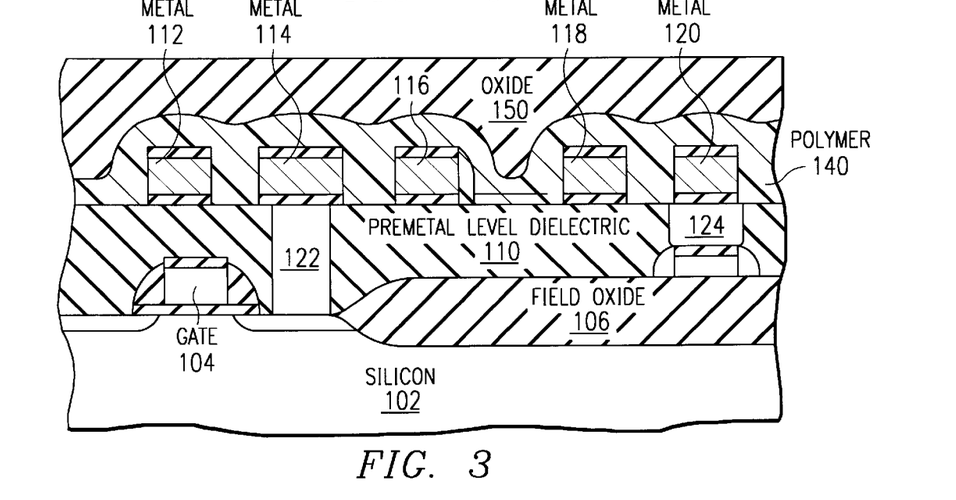
FIG. 3 illustrates steps of a second preferred embodiment and method.

FIG. 3 illustrates a second preferred embodiment method for IMD fabrication. In particular, begin as with the first preferred embodiment and deposit parylene polymer 130 over metal lines 112–120 as shown in FIGS. 1a–b. Then fluorinate polymer 130 to form fluorinated polymer 140 as illustrated in FIG. 1c.

Then deposit (fluorinated) oxide layer 150 to a thickness of at least 1 $\mu$m on fluorinated polymer 140. Then planarize oxide 150 with CMP; see FIG. 3. The oxide deposition again may be by plasma-enhanced TEOS deposition and completes the intermetal level dielectric which consists of fluorinate parylene polymer 140 (dielectric constant 2.3–2.4) adjacent the metal lines plus planarized oxide 150 (dielectric constant 3.5 for fluorinated oxide or 4.0 for undoped oxide). Thus the IMD has very low dielectric constant polymer in the more important regions plus the robustness of planar oxide level to built the wiring lines. Again, vertical vias through oxide 150 and fluorinated polymer 140 would provide interlevel connections.

Multiple metal layers preferred embodiment

Figure 4A:
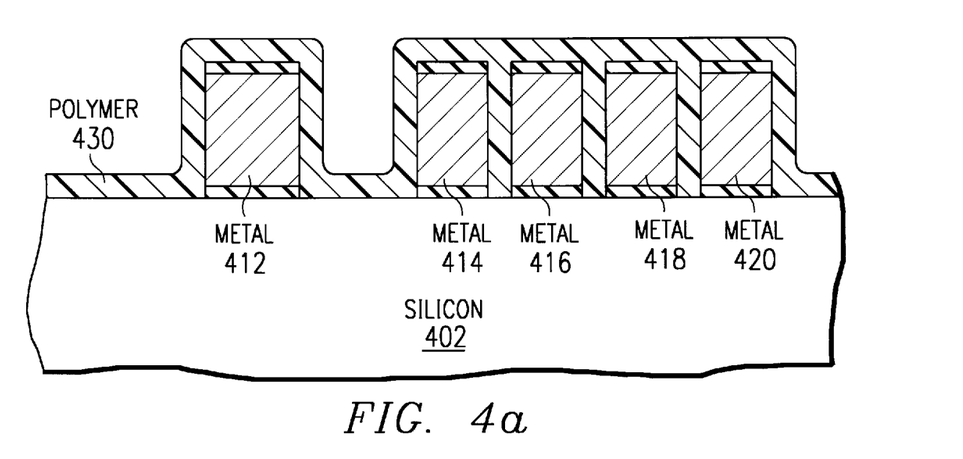
FIGS. 4a–c show successive applications of the second preferred embodiment.
Figure 4B:
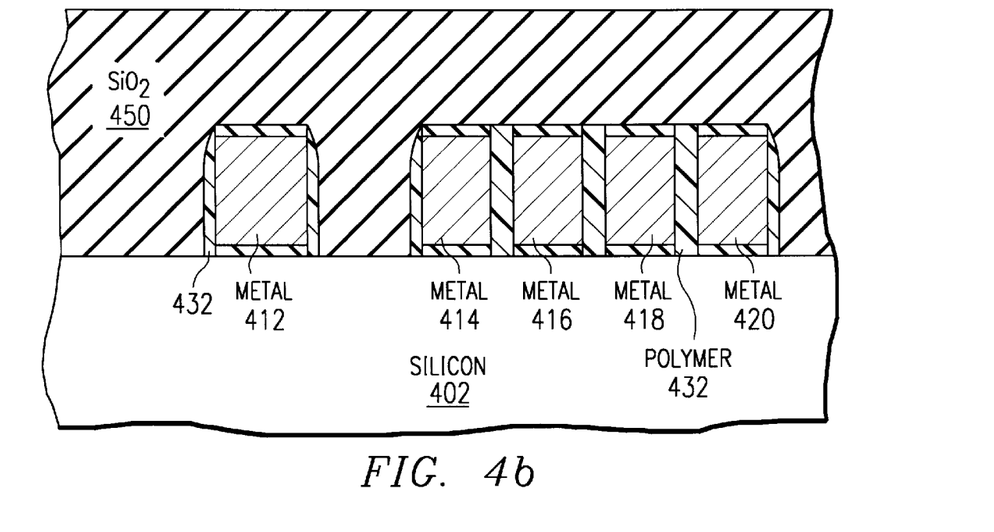
Figure 4C:
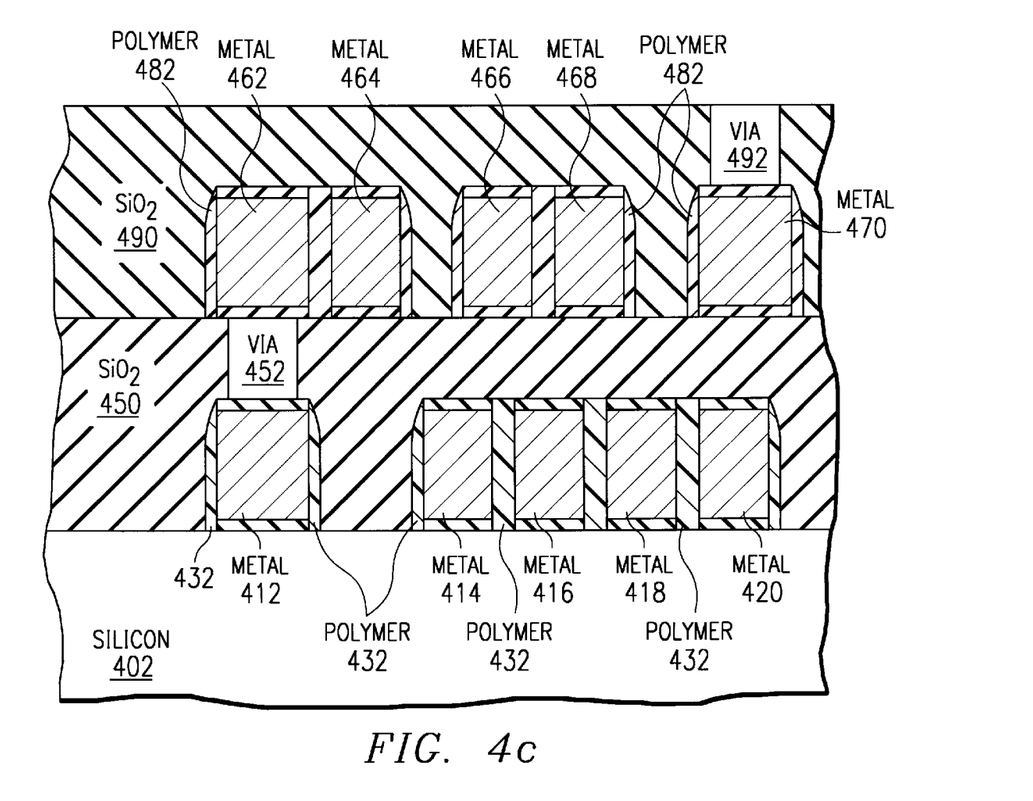

FIGS. 4a–c show two successive applications of the first preferred embodiment type of IMD for two successive metal levels. In particular, FIG. 4a shows parylene 430 conformally deposited over metal lines 412–420 on insulator 402 and then fluorinated and annealed. Metal lines 414–420 are about 0.25 $\mu$m wide and 0.7 $\mu$m high with 0.25 $\mu$m spacings, metal line 412 is about 0.4 $\mu$m wide and represents a widening of a metal line for vertical via connection. Again, the metal could be aluminum with cladding such as TiN on both the top and bottom.

FIG. 4b shows polymer 432 etched back to fill between the closely spaced metal lines and form sidewalls on the others. FIG. 4b also shows planarized oxide 450 covering the metal lines and polymer to a thickness of about 0.7 $\mu$m. Oxide 450 could be plasma-enhanced deposited with subsequent CMP for planarization.

FIG. 4c shows metal-filled via 452 connecting first level metal line 412 through oxide 450 up to second level metal line 462 together with other second level metal lines 464–470 on oxide 450. Etched back polymer 482 (again, parylene vapor deposited, fluorinated, and annealed) fills in between closely spaced metal lines 462–470 and forms sidewalls spacers on others, and planarized oxide 490 covers the second level metal lines. Metal-filled via 492 connects second level metal line 470 to third level metal lines (not shown) later formed on oxide 490. Metal-filled vias 452 and 492 may be formed by first photolithographic patterning and etch the oxide followed by filling with tungsten through either blanket deposition plus etchback or selective deposition or by CVD aluminum or aluminum reflow of overlying metal lines. The metal lines are formed by blanket metal deposition followed by photolithographic patterning and anisotropic etching.

Polymer refill preferred embodiment

Figure 5A:
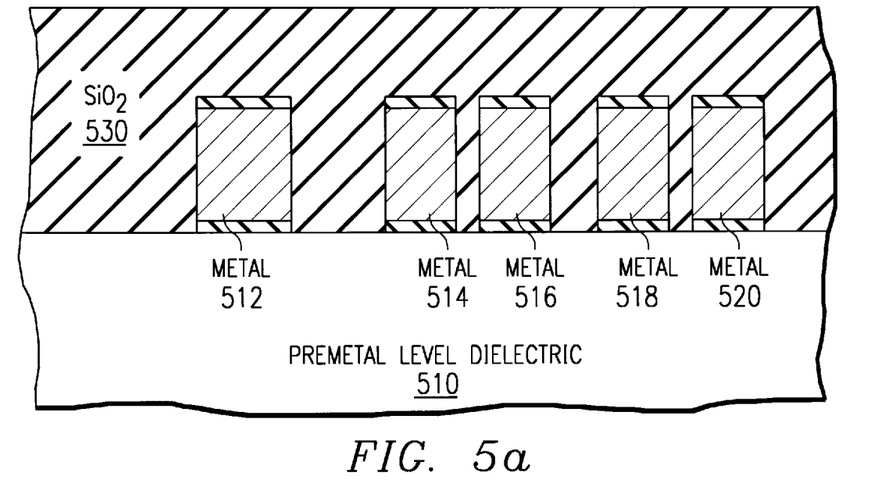
FIGS. 5a–d illustrate successive applications of the third preferred embodiment.
Figure 5B:
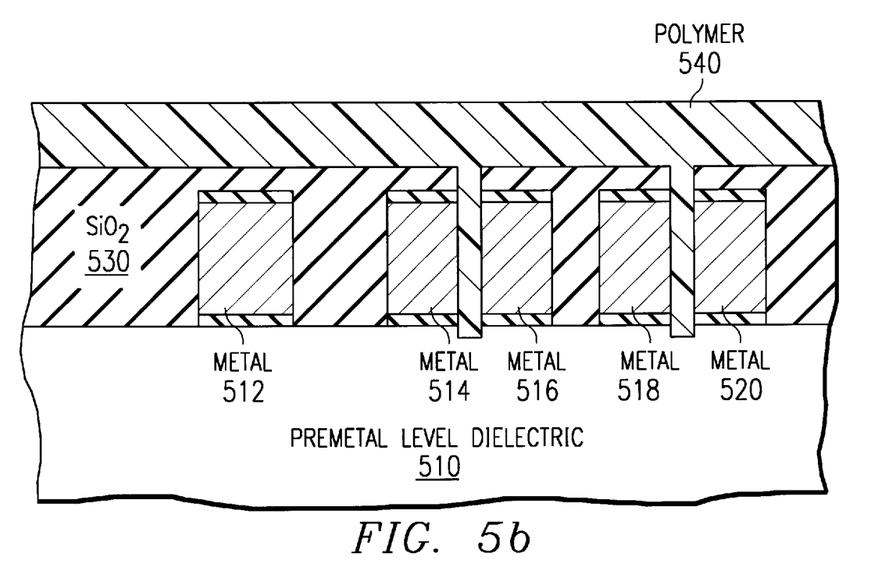

FIGS. 5a–d illustrate in cross sectional elevation views two successive applications of a third preferred embodiment type of IMD for two successive metal levels. Indeed, FIG. 5a shows metal lines 512–520 on insulating layer 510 and with planarized (fluorinated) oxide layer 530 overlying the metal lines. Metal lines 514, 516, 518, and 520 have a minimal linewidth, about 0.25 $\mu$m wide, and a height of about 0.7 $\mu$m; whereas, metal line 512 indicates a width increase to about 0.4 $\mu$m for via alignment ease. The spacings between the metal lines in metal line pairs 514–516 and 518–520 are minimal, about 0.25 $\mu$m, but other spacings are larger. The metal lines are formed by blanket deposition followed by photolithographic patterning; the metal could be cladded aluminum.

Photolithographically locate the minimal metal line spacings and etch oxide 530 out from the minimal spacings. The etch may be an anisotropic plasma etch or could be selective with respect to the metal and use the metal lines as lateral etchstops. An overetch into the underlying insulator 510 may be used and will help suppress fringing fields between metal lines.

After the oxide etch, conformally deposit parylene polymer 540 as previously described. A conformal deposition thickness of at least 0.125 $\mu$m will fill the minimal spacings except for possible voids; and thicker deposition will yield a roughly planar surface over the minimal spacings as in FIG. 5b which illustrates a deposition of about 0.4 $\mu$m. Then fluorinate the parylene as previously described and anneal.

Figure 5C:
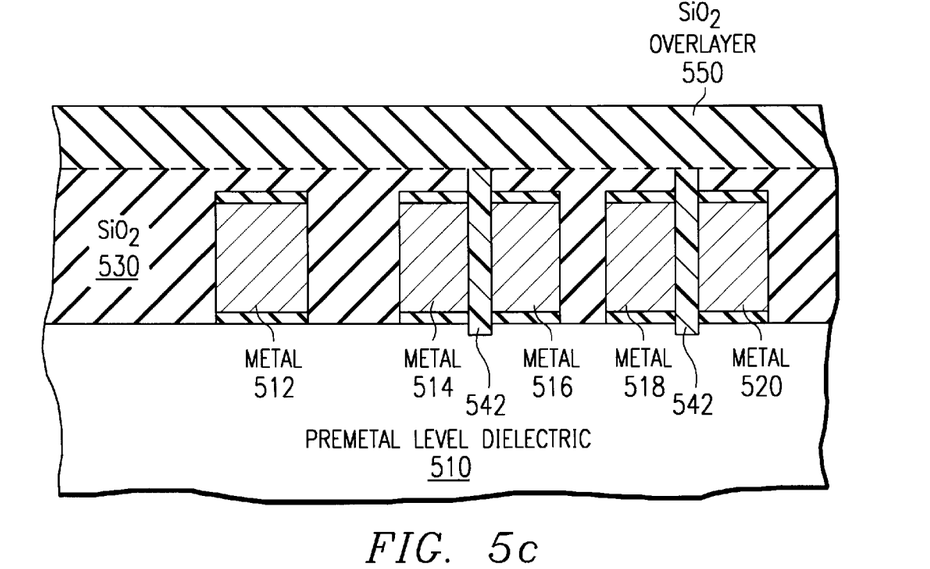
Figure 5D:
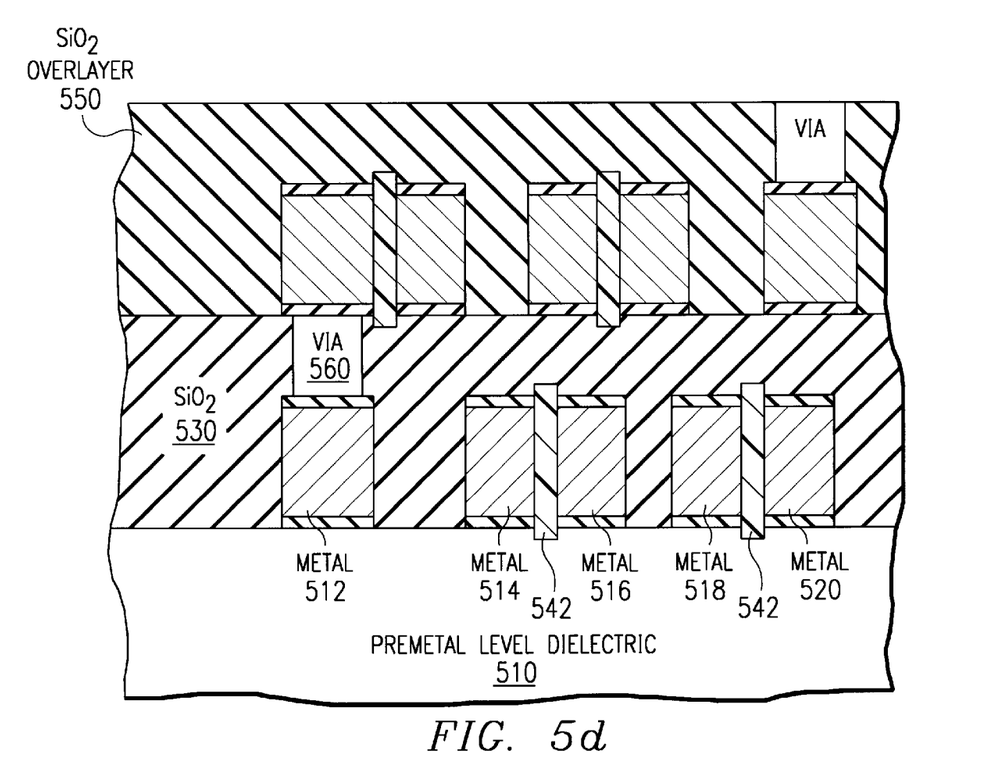

FIG. 5c shows an etchback of polymer 540 to leave only polymer fillers 542 in the minimal spacings. After the polymer etchback, deposit about 0.5 $\mu$m of oxide 550. Alternatively, the polymer etchback may be performed prior to the fluorination; in this case the fluorination swelling of the parylene could compensate somewhat for an overetch.

The metal level is completed by photolithographically defining and etching vias in oxides 530–550 to the wide portions of the metal lines such as metal line 512; then fill the vias by either selective metal deposition or blanket deposition and etchback. The vias may be filled with tungsten with a barrier layer. The metal-filled vias 560 provide connection to a second metal level which is formed in the same manner as the metal level just described; see FIG. 5d. An alternative would be to deposit the metal which fill vias 560 and is patterned to form the second level metal lines in as a single step. This could be any conformal metal deposition method such as chemical vapor deposition or a reflow of metal such as aluminum; optionally a sputtered barrier metal layer could be initially deposited.

Applications

The foregoing fluorinated (co)polymers between metal (or other conductive) lines can be applied to various integrated circuit types. For example, DRAMs have many sets of long parallel conductive lines such as bitlines, wordline straps, address and data busses, and so forth, and the fluorination method insure gap filling within such sets of parallel lines to cut down capacitive coupling. The fluorinated (co)polymer may be located directly over transistors (e.g., between metal lines 112–114 in FIG. 1c) or offset over transistors (e.g., between metal lines 118–120 in FIG. 1c) or over or under other metal lines.

Modifications

Modifications of the polymer with fluorination after vapor deposition can be made while retaining most of their properties.

For example, a very thin conformal adhesion/barrier layer of oxide could be deposited prior to parylene (or other (co)polymer) deposition.

Further, the oxide deposition followed by CMP could be replaced by alternative planarization approaches. Indeed, a spin-on glass alternative follows the steps shown in FIGS. 1a–d (first preferred embodiment) or FIGS. 1a–c (second preferred embodiment) but then replaces the oxide deposition plus CMP planarization with a spin on glass planarization. In particular, spin on hydrogen silsesquioxane (HSQ) to an average thickness of about 0.5 $\mu$m; this will fill in low lying portions (either exposed PMD between sidewall polymers or low lying polymer) and will be only about 0.05 $\mu$m thick over narrow metal line plus polymer structures. This provides the majority of the planarization.

Then cure the HSQ and deposit a layer of (flourinated oxide) on the HSQ. The deposition may be plasma enhanced and under planarizing conditions (high bias) or a planarization such as CMP or resist etchback can be used if greater planarity is needed. The completed IMD is made up of fluorinated polymer (dielectric constant of about 2.3– 2.4) adjacent the metal wiring, HSQ (dielectric constant of roughly 3.0) filling in between laterally, and (fluorinated) oxide (dielectric constant of perhaps 3.5 for fluorinated oxide) extending up to the next metal level.

Alternative spin on glasses could be used and an etchback may be included to thin the dielectric layer. In particular, the spin on glass could be totally removed on the polymer over the metal lines and only remain in the crevices and low areas between sets of metal lines.

What is claimed is:

1. A method of forming integrated circuit insulation material, comprising the steps of:

(a) depositing a (co)polymer on a partially fabricated integrated circuit;

(b) substituting fluorine into said (co)polymer;

(c) etching said fluorinated (co)polymer; and (d) forming an insulating layer over said etched fluorinated (co)polymer.

2. The method of claim 1, wherein:

(a) said (co)polymer contains parylene.

3. The method of claim 1, wherein:

(a) said substituting fluorine is exposure to diluted fluorine gas.

4. The method of claim 3, wherein:

(a) said exposure to diluted fluorine gas is at a pressure of less than about 1 atmosphere and a temperature of less than about 35 C.

5. The method of claim 1, wherein:

(a) said substituting fluorine occurs at about 60–70% of available sites for fluorine.

* * * * *